(12) United States Patent
Kim et al.

(10) Patent No.: US 10,117,325 B2
(45) Date of Patent: Oct. 30, 2018

(54) CIRCUIT STRUCTURE HAVING TWO TRANSMISSION LINES SEPARATED BY A GUARD PATTERN DEFINED BY A FIRST LONGITUDINAL PATTERN AND SECOND PATTERNS ORTHOGONAL TO THE FIRST PATTERN

(71) Applicant: LG ELECTRONICS INC., Seoul (KR)

(72) Inventors: Inmu Kim, Seoul (KR); Youngmin Cho, Seoul (KR); Kipyoung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/178,607

(22) Filed: Jun. 10, 2016

(65) Prior Publication Data

US 2017/0215273 A1    Jul. 27, 2017

(30) Foreign Application Priority Data

Jan. 22, 2016    (KR) ........................ 10-2016-0007909

(51) Int. Cl.
*H05K 1/02*    (2006.01)
*H01P 3/02*    (2006.01)
(Continued)

(52) U.S. Cl.
CPC ............. *H05K 1/0219* (2013.01); *H01P 3/02* (2013.01); *H01P 3/026* (2013.01); *H01P 3/081* (2013.01);
(Continued)

(58) Field of Classification Search
CPC ....... H01P 3/026; H01P 3/081; H05K 1/0218; H05K 1/0219; H05K 1/0224; H05K 1/0228
(Continued)

(56) References Cited

U.S. PATENT DOCUMENTS 6,133,805 A * 10/2000 Jain et al. ............... H01P 3/088
333/1
6,380,818 B1 * 4/2002 Lee .......................... H01P 3/08
333/1
(Continued)

FOREIGN PATENT DOCUMENTS

| KR | 10-2009-0106035 | 10/2009 |
| WO | WO 2009/154335 | 12/2009 |
| WO | WO 2013/100432 | 7/2013 |

OTHER PUBLICATIONS

International Search Report and Written Opinion dated Oct. 18, 2016 issued in Application No. PCT/KR2016/006102 (full English text).

*Primary Examiner* — Benny Lee (74) *Attorney, Agent, or Firm* — Ked & Associates, LLP (57) ABSTRACT

A circuit structure and a mobile terminal having a circuit structure are disclosed. The circuit structure may include two transmission lines that extend in a first direction to transmit a signal, and a guard pattern provided between the two transmission lines. The guard pattern may include a plurality of slots each having an open end and a closed end in a second direction. The guard pattern arranged between the transmission lines may lower cross talk by adjusting mutual capacitance so as to improve signal quality.

16 Claims, 10 Drawing Sheets

(51) Int. Cl.
  *H01P 3/08*  (2006.01)
  *H04B 1/3888*  (2015.01)
  *H05K 1/11*  (2006.01)
  *H04M 1/02*  (2006.01)

(52) U.S. Cl.
  CPC ......... *H04B 1/3888* (2013.01); *H05K 1/0216* (2013.01); *H05K 1/0237* (2013.01); *H05K 1/115* (2013.01); *H04M 1/0266* (2013.01); *H04M 1/0277* (2013.01)

(58) Field of Classification Search
  USPC .......................................................... 333/1
  See application file for complete search history.

(56) References Cited

U.S. PATENT DOCUMENTS

| | | | |
|---|---|---|---|
| 6,433,648 B1* | 8/2002 | Lee ....................... | H01L 23/642 333/1 |
| 7,659,791 B2* | 2/2010 | Park et al. ........... | H05K 1/0219 333/1 |
| 8,058,954 B2* | 11/2011 | Yeates ....................... | H01P 3/08 333/1 |
| 2007/0236303 A1* | 10/2007 | Lee et al. ................ | H01P 3/081 333/1 |
| 2008/0053694 A1 | 3/2008 | Park et al. | |
| 2010/0156559 A1 | 6/2010 | Wang et al. | |
| 2011/0090028 A1* | 4/2011 | Park et al. .............. | H01P 3/081 333/238 |

* cited by examiner

$$V_f \propto \frac{L_m}{L_s} - \frac{C_m}{C_s + C_m}$$

CIRCUIT STRUCTURE HAVING TWO TRANSMISSION LINES SEPARATED BY A GUARD PATTERN DEFINED BY A FIRST LONGITUDINAL PATTERN AND SECOND PATTERNS ORTHOGONAL TO THE FIRST PATTERN

CROSS-REFERENCE TO RELATED APPLICATION

This application claims priority under 35 U.S.C. § 119 to Korean Patent Application No. 10-2016-0007909 filed on Jan. 22, 2016, whose entire disclosure is incorporated herein by reference.

BACKGROUND

1. Field

Embodiments relate to a circuit structure and a mobile terminal including a circuit structure.

2. Background

Terminals may be classified as mobile/portable terminals or stationary terminals according to their mobility. Mobile terminals may also be classified as handheld terminals or vehicle mounted terminals according to whether or not a user may carry or hold the terminal. Mobile terminals may be used for data and voice communications, capturing images and video via a camera, recording audio, playing music files via a speaker system, and displaying images and video on a display, for example. Mobile terminals may include support game playing or multimedia players and may be configured to receive broadcast and multicast signals, which may permit viewing of content, such as, e.g., videos and television programs.

As mobile terminal usage becomes increasingly popular, more components may be mounted on smaller-sized mobile terminals, and much more data may travel through circuits in the mobile terminals. Accordingly, mobile terminals may have more complicated and integrated structures. Circuits in mobile terminals use electromagnetic signals, and, if many circuit lines are arranged close to each other, interference may occur in the circuit lines and thus, may generate noise.

BRIEF DESCRIPTION OF THE DRAWINGS

Embodiments will be described in detail with reference to the following drawings in which like reference numerals refer to like elements wherein.

DETAILED DESCRIPTION OF THE INVENTION

Figure 1A:
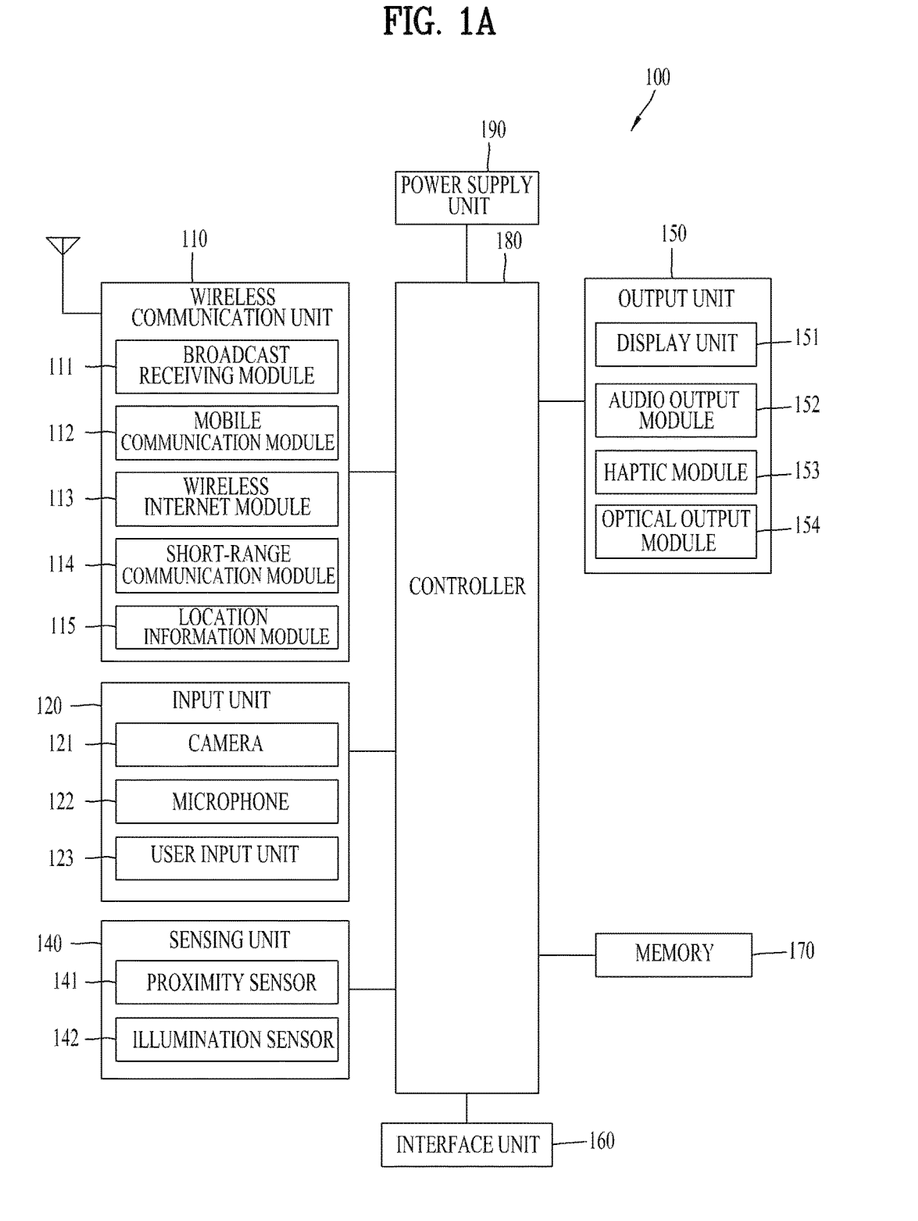
FIG. 1A is a block diagram of a mobile terminal in accordance with an embodiment.
Figure 1B:
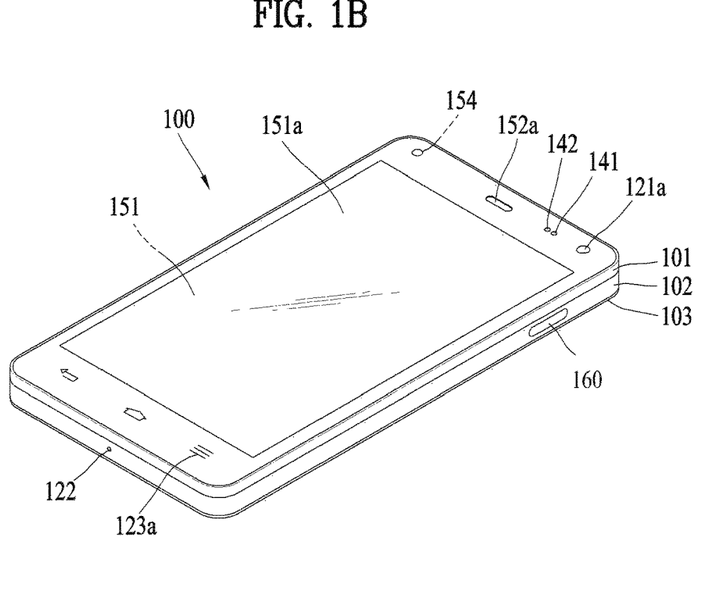
FIGS. 1B and 1C are conceptual views of the mobile terminal of FIG. 1A viewed from different directions.
Figure 1C:
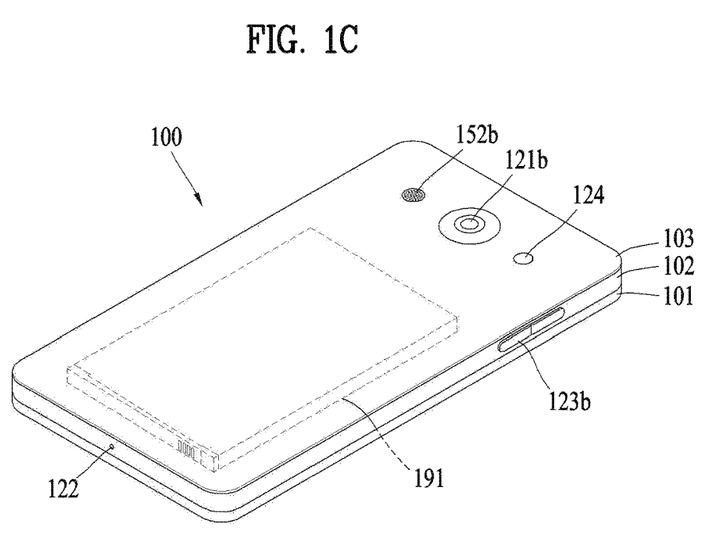

Referring to FIGS. 1A-1C, FIG. 1A is a block diagram of a mobile terminal according to an embodiment, and FIGS. 1B and 1C are conceptual views of the mobile terminal of FIG. 1A viewed from different directions. As shown in FIG. 1A, the mobile terminal 100 may include a wireless communication unit or communicator 110, an input unit or input 120, a sensing unit or sensor 140, an output unit or output 150, an interface unit or interface 160, a memory 170, a controller 180, and a power supply unit 190. Implementing all of the illustrated components is not a requirement, and that greater or fewer components may alternatively be implemented.

Referring to FIG. 1A, the mobile terminal 100 may include the wireless communication unit 110 configured with several components. For instance, the wireless communication unit 110 may include one or more components that permit wireless communication between the mobile terminal 100 and a wireless communication system or network, within which the mobile terminal may be located. The wireless communication unit 110 may include one or more modules, which may permit communications, for example, wireless communications, between the mobile terminal 100 and a wireless communication system, communications between the mobile terminal 100 and another mobile terminal, and communications between the mobile terminal 100 and an external server. Further, the wireless communication unit 110 may include one or more modules, which may connect the mobile terminal 100 to one or more networks.

To facilitate such communications, the wireless communication unit 110 may include one or more of a broadcast receiving module 111, a mobile communication module 112, a wireless Internet module 113, a short-range communication module 114, and a location information module 115.

The input unit 120 may include a camera 121 to obtain images or video, a microphone 122, which may be one type of audio input device for inputting an audio signal, and a user input unit or portion 123, such as, e.g., a touch key, a push key, a mechanical key, a soft key, to allow a user to input information. Data, such as, e.g., audio, video, and images, may be obtained by the input unit 120 and may be analyzed and processed by controller 180 according to device parameters, user commands, and combinations thereof.

The sensing unit 140 may include one or more sensors configured to sense, for example, internal information of the mobile terminal, the surrounding environment of the mobile terminal, and user information. For example, as shown in FIG. 1A, the sensing unit 140 may include a proximity sensor 141 and an illumination sensor 142. The sensing unit 140 may alternatively or additionally include other types of sensors or devices, such as, e.g., a touch sensor, an acceleration sensor, a magnetic sensor, a Gravity-sensor, a gyroscope sensor, a motion sensor, an RGB sensor (red green blue sensor, color sensor), an infrared (IR) sensor, a finger scan sensor, a ultrasonic sensor, an optical sensor, for example, camera 121, a microphone 122, a battery gauge, an environment sensor, for example, a barometer, a hygrometer, a thermometer, a radiation detection sensor, a thermal sensor, and a gas sensor, among others, and a chemical sensor, for example, an electronic nose, a health care sensor, and a biometric sensor, to name a few. The mobile terminal 100 may be configured to utilize information obtained from sensing unit 140, and information obtained from one or more sensors of the sensing unit 140, and combinations thereof.

The output unit 150 may be configured to output various types of information, such as, e.g., audio, video, and tactile output. The output unit 150 may include a display unit or display 151, an audio output module 152, a haptic module 153, and an optical output module 154. The display unit 151 may have an inter-layered structure or an integrated structure with a touch sensor in order to provide a touch screen. The touch screen may provide an output interface between the mobile terminal 100 and a user, as well as function as the user input unit 123, which may provide an input interface between the mobile terminal 100 and the user.

The interface unit 160 may serve as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, and earphone ports. The mobile terminal 100 may perform assorted control functions associated with a connected external device in response to the external device being connected to the interface unit 160.

The memory 170 may store data to support various functions or features of the mobile terminal 100. For example, the memory 170 may be configured to store application programs executed in the mobile terminal 100 and data or instructions for operations of the mobile terminal 100. Some of these application programs may be downloaded from an external server via wireless communication. Other application programs may be installed within the mobile terminal 100 at a time of manufacturing or shipping, for example, basic functions of the mobile terminal 100, such as, e.g., receiving a call, placing a call, receiving a message, and sending a message. Application programs may be stored in the memory 170, installed in the mobile terminal 100, and executed by the controller 180 to perform an operation or function for the mobile terminal 100.

The controller 180 may control overall operation of the mobile terminal 100, in addition to operations associated with the application programs. The controller 180 may provide or process information or functions by processing signals, data, and information input or output by the various components depicted in FIG. 1A, or activating application programs stored in the memory 170. The controller 180 may control some or all of the components illustrated in FIGS. 1A-1C according to an application program that may have been stored in the memory 170.

The power supply unit 190 may be configured to receive external power or provide internal power in order to supply power to operate elements and components included in the mobile terminal 100. The power supply unit 190 may include a battery, and the battery may be configured to be embedded in the terminal body, or configured to be detachable from the terminal body.

Referring to FIGS. 1B and 1C, the mobile terminal 100 may be a bar-type terminal body, but embodiments are not limited thereto. For example, configurations of the mobile terminal 100 may include a watch-type, a clip-type, a glasses-type, or as a folder-type, flip-type, slide-type, swing-type, and swivel-type, in which two and more bodies may be combined with each other in a relatively movable manner, and combinations thereof. Discussion herein may often relate to a particular type of mobile terminal, however, such teachings with regard to a particular type of mobile terminal apply to other types of mobile terminals as well. For example, the terminal body may be a unit-body and may be configured to define an inner space of the mobile terminal.

Figure 2:
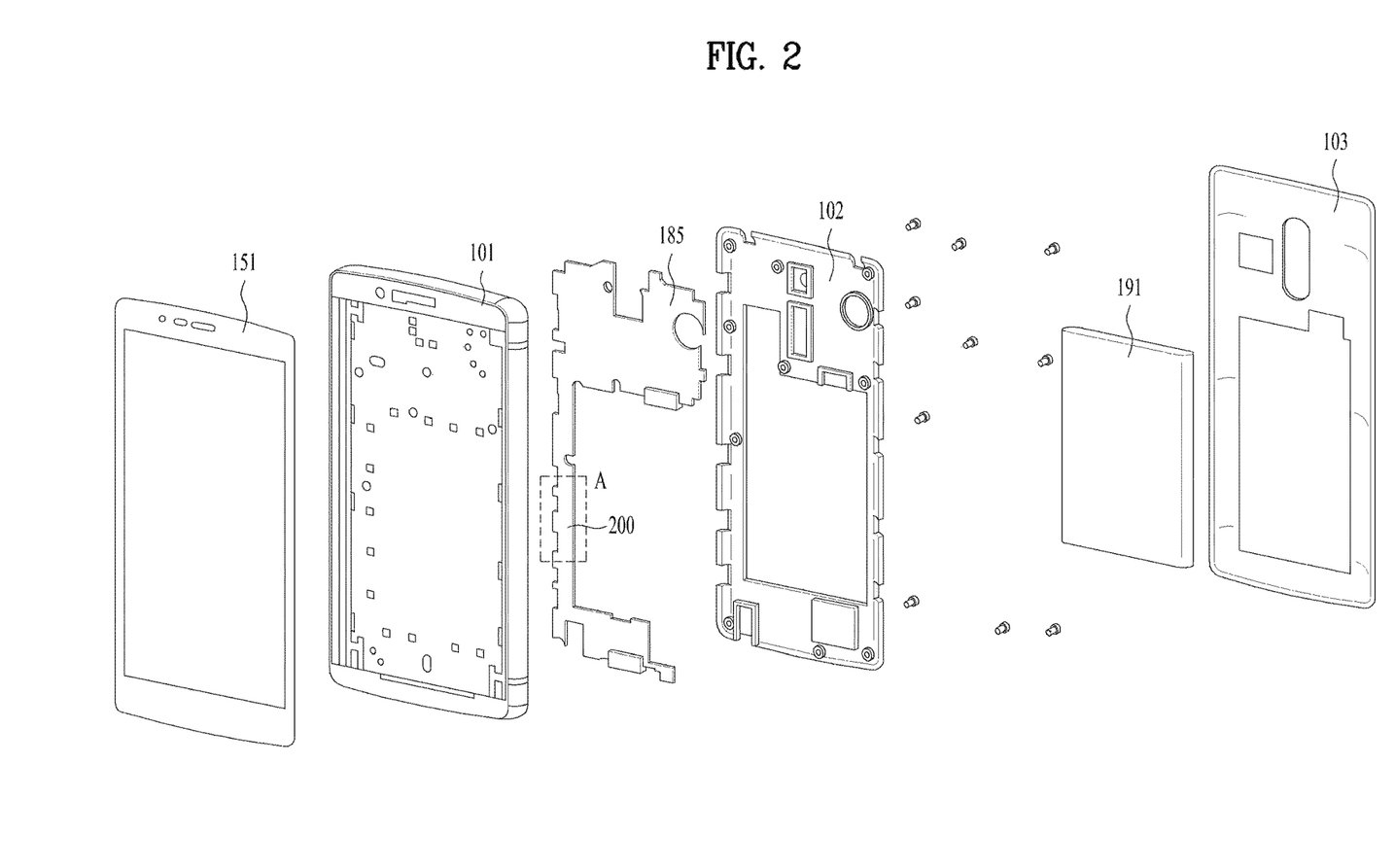
FIG. 2 is an exploded perspective diagram of a mobile terminal according to an embodiment.

As illustrated in FIG. 2, the mobile terminal 100 may include a front case 101 supporting a back side of the display unit 151, a main board 185 arranged in a back side of the display unit, a rear case 102 coupled to the front case 101 at a back side of the main board 185, and a battery cover 103 configured to cover the rear case 102 and a battery 191. The mobile terminal 100 may include a case, such as, e.g., a frame, housing, and cover, that forms an appearance of the terminal. The case may be formed using a front case 101 and a rear case 102. Various electronic components may be incorporated into a space formed between the front case 101 and the rear case 102. At least one middle case may be positioned between the front case 101 and the rear case 102.

As shown in FIG. 1B, the display unit 151 may be located on a front side of the terminal body to output information. As illustrated, a window 151a of the display unit 151 may be mounted to the front case 101 to form the front surface of the terminal body together with the front case 101. Electronic components may also be mounted to the rear case 102. Examples of such electronic components may include a detachable battery 191, an identification module, a memory card, and the like. A rear cover 103 may cover the electronic components, and may be detachably coupled to the rear case 102. Therefore, when the rear cover 103 is detached from the rear case 102, the electronic components mounted to the rear case 102 may be exposed. When the rear cover 103 is coupled to the rear case 102, a side surface of the rear case 102 may be partially exposed. Upon coupling, the rear case 102 may also be completely shielded by the rear cover 103. Alternatively, the rear cover 103 may include an opening for externally exposing a camera 121b or an audio output module 152b as shown in FIG. 1C. The cases 101, 102, 103 may be formed by injection-molding synthetic resin or may be formed of a metal, for example, stainless steel (STS), aluminum (Al), and/or titanium (Ti).

As an alternative to an embodiment in which the plurality of cases form an inner space for accommodating components, the mobile terminal 100 may be configured such that one case forms the inner space. For example, a mobile terminal 100 having a uni-body may be formed in such a manner that synthetic resin or metal may extend from a side surface to a rear surface. If desired, the mobile terminal 100 may include a waterproofing unit to prevent introduction of water into the terminal body. For example, the waterproofing unit may include a waterproofing member located between the window 151a and the front case 101, between the front case 101 and the rear case 102, or between the rear case 102 and the rear cover 103, to hermetically seal an inner space when those cases are coupled.

As shown in FIGS. 1B and 1C, the mobile terminal 100 may include the display unit 151, first and second audio output modules 152a (FIG. 1B) and 152b (FIG. 1C), a proximity sensor 141 (FIG. 1B), an illumination sensor, an optical output module 154 (FIG. 1B), first and second cameras 121a (FIG. 1B) and 121b (FIG. 1C), first and second manipulation units or buttons 123a (FIG. 1B) and 123b (FIG. 1C), a microphone 122 and an interface unit 160 (FIG. 1B). FIGS. 1B and 1C show an embodiment of the mobile terminal 100 having various modules and components. A front side of the terminal body as shown in FIG. 1B may include the first display unit 151, the first audio output module 152a, the proximity sensor 141, the illumination sensor 142, the optical output module 154, the first camera 121a and the first manipulation unit 123a. A lateral side of the terminal body may include the first manipulation unit 123b, the microphone 122 and the interface unit 160 (FIG. 1B). A back side of the terminal body may include the second audio output module 152b and the second camera 121b as shown in FIG. 1C.

The illustrated arrangement of the components in FIGS. 1B and 1C is not required, and alternative arrangements may be possible and within the teachings of the present disclosure. Some components may be omitted or rearranged. For example, the first manipulation unit 123a may be located on another surface of the terminal body, and the second audio output module 152b may be located on the side surface of the terminal body.

The display unit 151 may be configured to output information processed in the mobile terminal 100. For example, the display unit 151 may display screen information of an application program being executed at the mobile terminal 100 or user interface (UI) and graphic user interface (GUI) information in response to the screen information.

The display unit 151 may output information processed in the mobile terminal 100. The display unit 151 may be, for example, a liquid crystal display (LCD), a thin film transistor-liquid crystal display (TFT-LCD), an organic light emitting diode (OLED), a flexible display, a 3-dimensional (3D) display, an e-ink display, and combinations thereof. The display unit 151 may be two display devices, which may implement substantially the same or different display technology. For instance, a plurality of the display units 151 may be arranged on one side, spaced apart from each other, or may be integrated, or may be arranged on different surfaces.

The display unit 151 may also include a touch sensor that senses a touch input received at the display unit. When the display unit 151 is touched, the touch sensor may be configured to sense a touch and the controller 180, for example, may generate a control command or other signal corresponding to the touch. The content input via the touch may be a text or numerical value, or a menu item, which may be indicated or designated in various modes. The touch sensor may be a film having a touch pattern provided between the window 151a and a display on a rear surface of the window 151a, or a metal wire patterned directly on the rear surface of the window 151a. Alternatively, the touch sensor may be integrally formed with the display. For example, the touch sensor may be provided on a substrate of the display or within the display.

The display unit 151 may also include a touch screen together with the touch sensor. The touch screen may serve as the user input unit 123 (see FIG. 1A). Therefore, the touch screen may replace at least some of the functions of the first manipulation unit 123a.

The first audio output module 152a may be a speaker to output, for example, voice audio, alarm sounds, multimedia audio reproduction. The window 151a of the display unit 151 may include an aperture to permit audio generated by the first audio output module 152a to pass. One alternative may be to allow audio to be released along an assembly gap between the structural bodies, for example, a gap between the window 151a and the front case 101. Thus, a hole independently formed to output audio sounds may not be seen or may be otherwise hidden in terms of appearance, thereby simplifying the appearance and manufacturing of the mobile terminal 100.

The optical output module 154 may be configured to output light to indicate an event generation, such as, for example, a message reception, a call signal reception, a missed call, an alarm, a schedule notice, an email reception, and information reception through an application. When a user has checked a generated event, the controller may control the optical output unit 154 to stop the light output. The first camera 121a may process image frames, such as, e.g., still or moving images obtained by the image sensor, in a capture mode or a video call mode. The processed image frames may then be displayed on the display unit 151 or stored in the memory 170.

The first and second manipulation units 123a and 123b may be examples of the user input unit 123, which may be manipulated by a user to provide input to the mobile terminal 100. The first and second manipulation units 123a and 123b may also be referred to as a manipulating portion, and may employ tactile methods that allow the user to perform manipulation, such as, e.g., touch, push, and scroll. The first and second manipulation units 123a and 123b may also employ non-tactile methods that allow the user to perform manipulation, such as, e.g., proximity touch and hovering.

As shown in FIG. 1B, the first manipulation unit 123a may be a touch key, but possible alternatives include a mechanical key, a push key, a touch key, and combinations thereof. Input received at the first and second manipulation units 123a and 123b may be used in various ways. For example, the first manipulation unit 123a may be used by the user to provide an input to a menu, home key, cancel, and search, and the second manipulation unit 123b may be used by the user to provide an input to control a volume level being output from the first or second audio output modules 152a or 152b and to switch to a touch recognition mode of the display unit 151.

The user input unit 123 may include a rear input unit located on the rear surface of the terminal body. The rear input unit may be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, and switch to a touch recognition mode of the display unit 151. The rear input unit may be configured to permit touch input, a push input, or combinations thereof.

The rear input unit may be located to overlap the display unit 151 in a thickness direction of the terminal body. The rear input unit may be located on an upper end portion of a rear side of the terminal body such that a user may easily manipulate it when the user grabs the terminal body with one hand. Alternatively, the rear input unit may be positioned at any location of the rear side of the terminal body. Embodiments that include the rear input unit may implement some or all of the functionality of the first manipulation unit 123a in the rear input unit. As such, if the first manipulation unit 123a is omitted from the front side, the display unit 151 may have a larger screen.

The mobile terminal 100 may include a finger scan sensor, which may scan a fingerprint. The controller 180 may use fingerprint information sensed by the finger scan sensor as part of an authentication procedure. The finger scan sensor may also be installed in the display unit 151 or at the user input unit 123. The microphone 122 may be located at an end of the mobile terminal 100, but other locations may be possible. If desired, multiple microphones may be implemented, with such an arrangement permitting receiving of stereo sounds.

The interface unit 160 may allow the mobile terminal 100 to interface with external devices. For example, the interface unit 160 may include one or more of a connection terminal to connect to another device, for example, an earphone and an external speaker, a port for near field communication, for example, an Infrared Data Association (IrDA) port, a Bluetooth port, and a wireless LAN port, or a power supply terminal to supply power to the mobile terminal 100. The interface unit 160 may be a socket that accommodates an external card, such as, e.g., a Subscriber Identification Module (SIM), User Identity Module (UIM), or a memory card for information storage.

The second camera 121b may be located at the rear side of the terminal body and include an image capturing direction that is substantially opposite to the image capturing direction of the first camera unit 121a. If desired, second camera 121a may be located at other locations, or made to be moveable, in order to have a different image capturing direction from an image capturing direction shown in FIG. 1C. The second camera 121b may include a plurality of lenses arranged along at least one line. The plurality of lenses may also be arranged in a matrix configuration. The cameras may be referred to as an "array camera." When the second camera 121b is an array camera, images may be captured in various manners using the plurality of lenses, and images with better qualities may result. As shown in FIG. 1C, a flash 124 may be adjacent to the second camera 121b. When an image of a subject is captured with the camera 121b, the flash 124 may illuminate the subject.

As shown in FIG. 1C, the second audio output module 152b may be located on the terminal body. The second audio output module 152b may provide stereophonic sound functions in conjunction with the first audio output module 152a as shown in FIG. 1B, and may be also used in a speaker phone mode for call communication.

At least one antenna for wireless communication may be located on the terminal body. The antenna may be installed in the terminal body or formed by the case. For example, an antenna that forms a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191 mounted in the terminal body or detachably coupled to an outside of the terminal body. The battery 191 may receive power via a power source cable connected to the interface unit 160. Also, the battery 191 (FIG. 1C) may be recharged wirelessly using a wireless charger. Wireless charging may occur via magnetic induction or electromagnetic resonance. The rear cover 103 may be coupled to the rear case 102 (FIG. 1C) to shield the battery 191, to prevent separation of the battery 191, and to protect the battery 191 from an external impact and from foreign material. When the battery 191 is detachable from the terminal body, the rear case 103 may be detachably coupled to the rear case 102.

Referring to FIG. 2, the controller 180 (FIG. 1A) may be provided on a type of a main board such as a printed circuit board, on which having diverse chips may be mounted. Various chips may be mounted on the main board 185 and may control the display unit and the audio output modules so that the controller may provide the user with information and process function commands or operations input via the user input unit and the one or more of the sensors and cameras.

If embodiments of the display unit of the mobile terminal become larger and an overall area of a front side becomes larger, the mobile terminal may retain a slim design, and the battery and the main board may be arranged on the same plane. The user input unit may be arranged in or at a lateral side of the mobile terminal and the camera, the audio output module and the diverse sensors may be arranged in or at an upper portion of the front side of the mobile terminal. The interface unit, the ear jack, the speaker and antenna may be provided. Accordingly, such arrangements of the components may be different from a simple arrangement, in which the main board and the battery may be arranged in one portion and the other opposite portion, respectively.

The main board 185 may be divided into upper and lower main boards with respect to the battery 191, with a connection board 200 to connect the upper and lower main boards with each other. The connection board 200 may be provided on the right or left of the battery 191, and the main board 185 may be configured with the upper main board, the lower main board and the connection board arranged in a ⊂-shape.

A plurality of transmission lines 211 (FIG. 3) may be arranged in the connection board 200 to connect the upper main board and the lower main board with each other. To minimize interference between them, the transmission lines 211 may be spaced as far as possible from each other. However, an inner space of the terminal may limit a distance between each two of the transmission lines 211. Other configurations may be provided between the transmission lines 211 to minimize the interference therebetween in the inner space.

Figure 3:
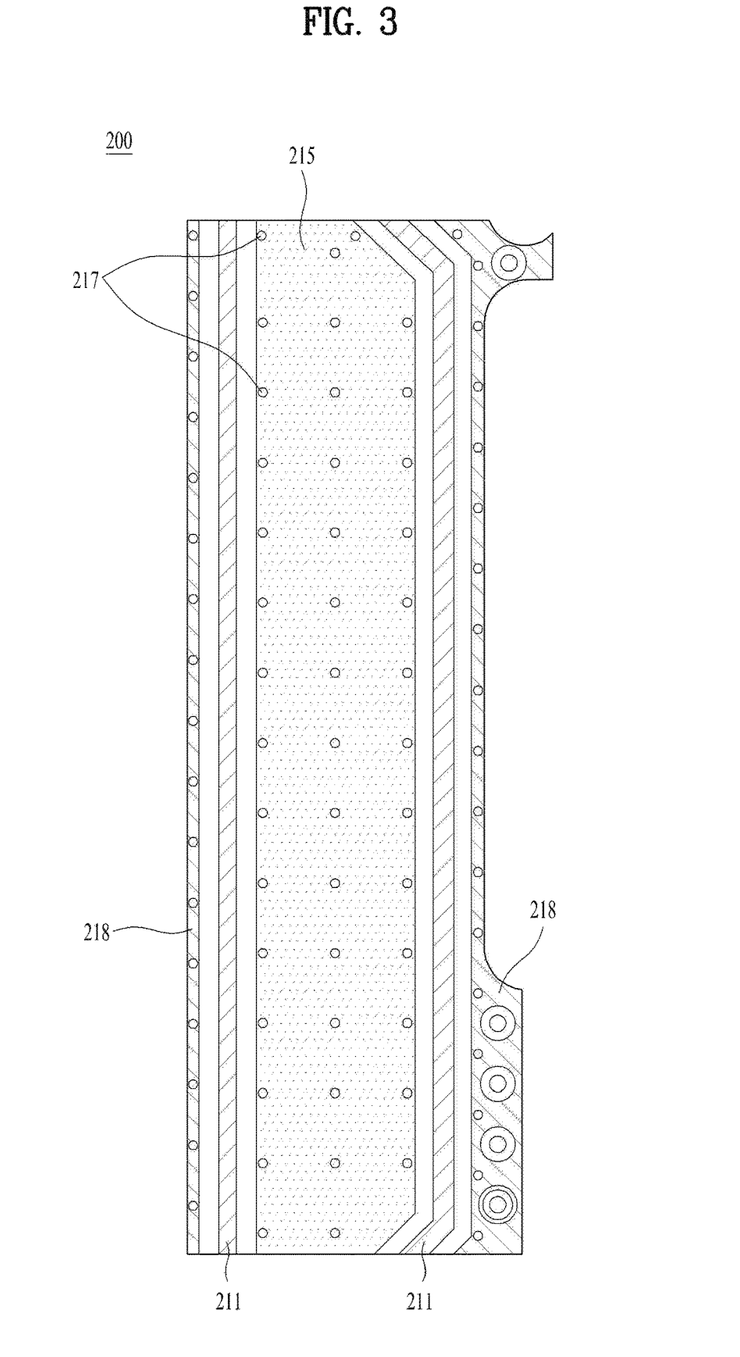
FIG. 3 is a diagram of a circuit structure or circuit according to an embodiment.

FIG. 3 is a diagram of a circuit structure or circuit shown in A of FIG. 2. Referring to FIG. 3, a circuit structure 200 may include two transmission lines 211 extended in a first direction, or a vertical direction as shown. However, embodiments may be applied to a circuit structure 200 having more than two transmission lines 211. Embodiments as shown may be applicable not only to the connection board of the mobile terminal but also to the upper and lower main boards, even to a chip-unit circuit, as the circuit structure 200 may reduce the interference between the transmission lines 211.

A first guard pattern 215 may be arranged between the two transmission lines 211 extended in the first direction, so that a possibility of interference between the transmission lines may be reduced. When the first guard pattern 215 is arranged between the two transmission lines 211 as shown in FIG. 3, an electromagnetic wave of one transmission line 211 may be blocked by the first guard pattern 215 and may have no influence on the other transmission line 211. A second guard pattern 218 may be formed in or at an outer portion with respect to the two transmission lines 211, and the second guard pattern 218 may block an external electromagnetic wave, which might have influence on the transmission lines 211, so as to prevent noise from being generated in the signal.

Figure 8:
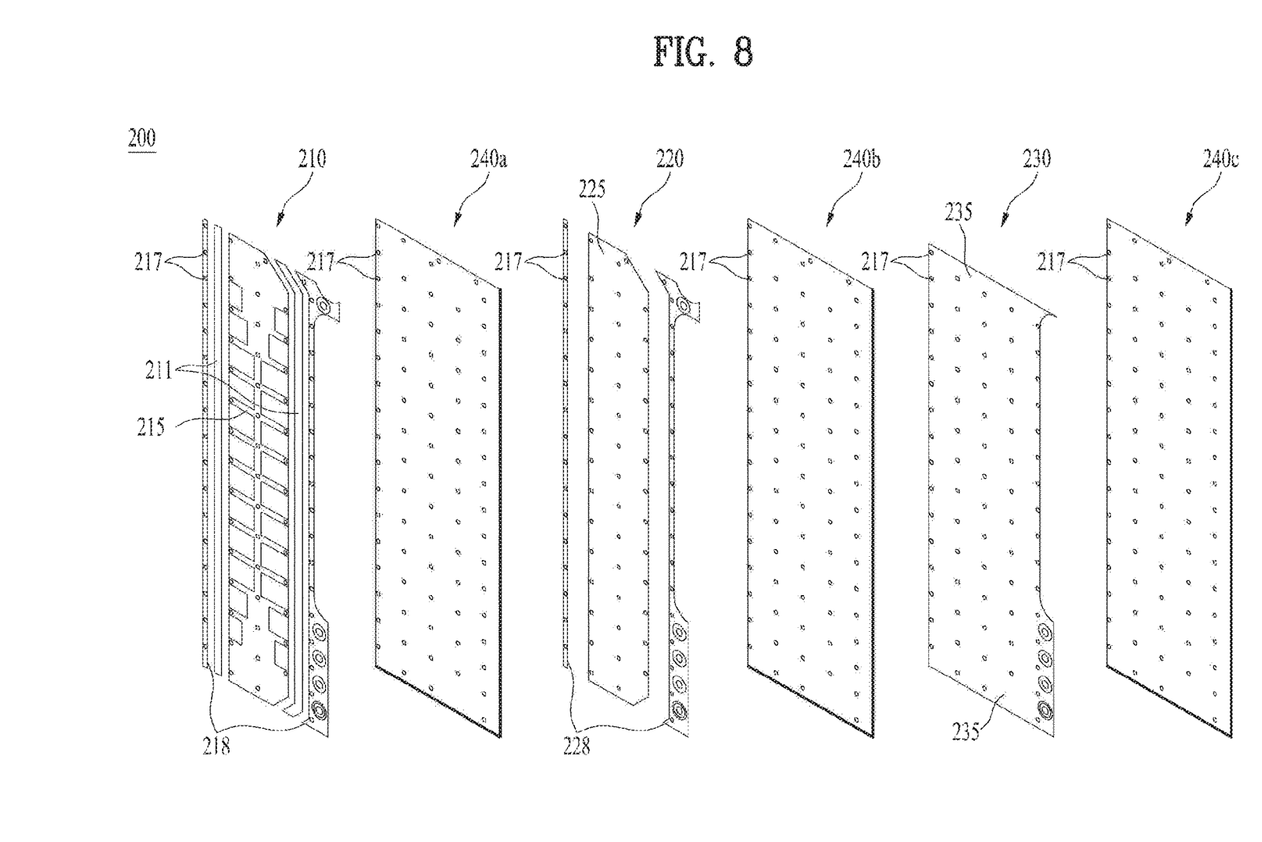
FIG. 8 is an exploded perspective diagram of FIG. 6.

A printed circuit board may be configured with a plurality of layers 210, 220 and 230 (see FIG. 8). As shown in FIG. 8, the layers may include insulative films 240a, 240b and 240c and conductive patterns 211, 215, 218, 225, 228 and 235, respectively. The conductive patterns may be formed on the insulative films, respectively. A via 217 may connect the conductive patterns 211, 215, 218, 225, 228 and 235 of the layers with each other. The via 217 may be an electric current structure with a via hole 217a, 217b (see FIG. 9B)

filled with a conductive material or of which a wall may be coated with the conductive material, so that the conductive patterns 211, 215, 218, 225, 228 and 235 formed in the layers 210, 220 and 230 may connect with each other. The connection board or circuit structure 200 may also be configured with a plurality of layers, and a third guard pattern 225 may be formed in or at a different layer. The first, second and third guard patterns 225 may be connected by the via 217. The layers 210, 220 and 230 may be provided sequentially and connected with each other by the via 217, and a wide guard pattern may be realized in a space.

Figure 4:
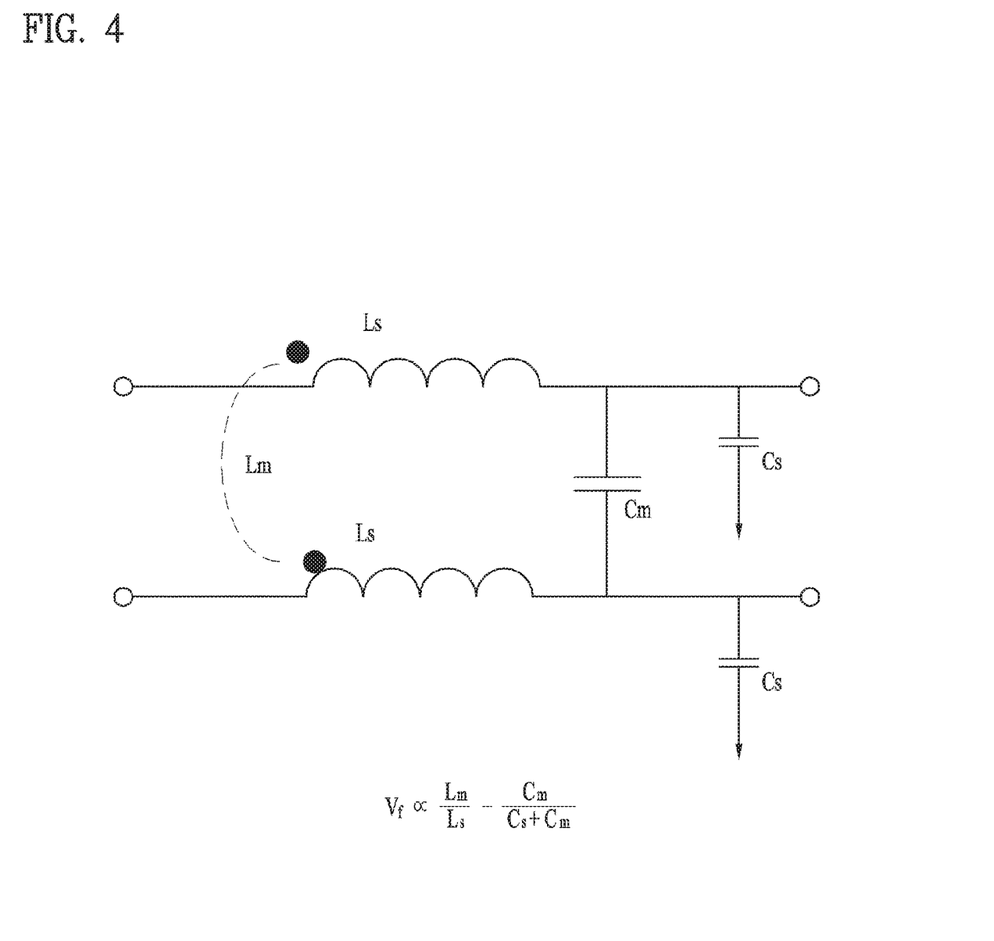
FIG. 4 is a conceptual diagram of cross talk between transmission lines and a corresponding mathematical equation.

FIG. 4 is a conceptual diagram and a corresponding mathematical equation of cross talk between the transmission lines 211 (see, e.g., FIG. 3). The cross talk may represent interference generated between the transmission lines 211. A signal of one transmission line 211 may flow to the other transmission line 211 and generate noise.

Each of the transmission lines 211 may have a self capacitance (Cs) and a self inductance (Ls), and the self capacitance (Cs) and the self inductance (Ls) of one transmission line 211 may be equal to those of another transmission line 211 for the sake of description. A mutual capacitance (Cm) and a mutual inductance (Lm) may be provided between the transmission lines 211. When a conductive material or the first guard pattern 215 is provided between the transmission lines 211, the mutual capacitance (Cm) may change, and cross talk may change accordingly.

As shown in FIG. 4, cross talk ($V_f$) may be proportional to a value gained by subtracting the mutual capacitance/total capacitance (Cm/(Cm+Cs)) from the mutual inductance/self inductance (Lm/Ls). When the mutual capacitance (Cm), the self capacitance (Cs), the mutual inductance (Lm) and the self inductance (Ls) change according to the arrangement and shape of the first guard pattern 215 (see, e.g., FIG. 3), the value may change, and a value of crosstalk may change.

Unless the first guard pattern 215 (see, e.g., FIG. 3) is formed between the transmission lines 211, the mutual capacitance/self inductance (Lm/Ls) may be larger than the mutual capacitance/total capacitance (Cm/(Cm+Cs)). If the mutual capacitance (Cm) becomes larger, the mutual capacitance/total capacitance (Cm/(Cm+Cs)) may become larger, and cross talk (Vf) also may become smaller.

To enlarge the mutual capacitance (Cm), the first guard pattern 215 may be arranged. The mutual capacitance (Cm) may change according to a shape of the first guard pattern 215 so that a width of the first guard pattern 215 may be partially adjusted to be smaller in order to enlarge the mutual capacitance (Cm). A plurality of slots 216 (FIG. 6) may be formed in the first guard pattern 215 to adjust the mutual capacitance (Cm), and the slots 216 may have open ends and closed ends with respect to a second direction.

Figure 5:
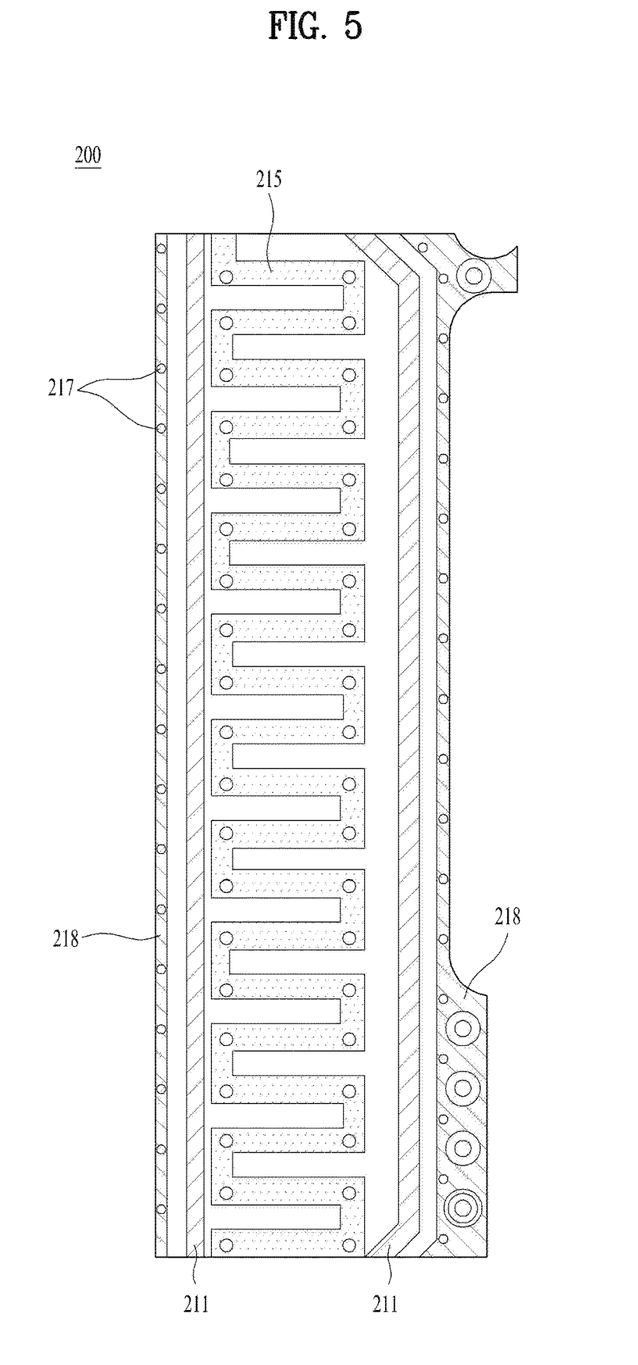
FIG. 5 is a diagram of a circuit structure or circuit according to another embodiment.

FIG. 5 is a diagram of a circuit structure or circuit according to another embodiment. In circuit structure 200 of transmission lines 211, first guard pattern 215 may be formed in a meander shape, for example, a meander guard pattern. For such a meander shape, slots may be arranged side by side in a first direction, or a vertical direction as shown in FIG. 5, with open ends alternatively arranged in one direction and other portions with respect to a second direction, or left and right portions as shown in FIG. 5. A mutual capacitance (Cm) as schematically shown in FIG. 4 between the transmission lines 211 may become larger according to the first guard pattern that is meander-shaped.

Figure 6:
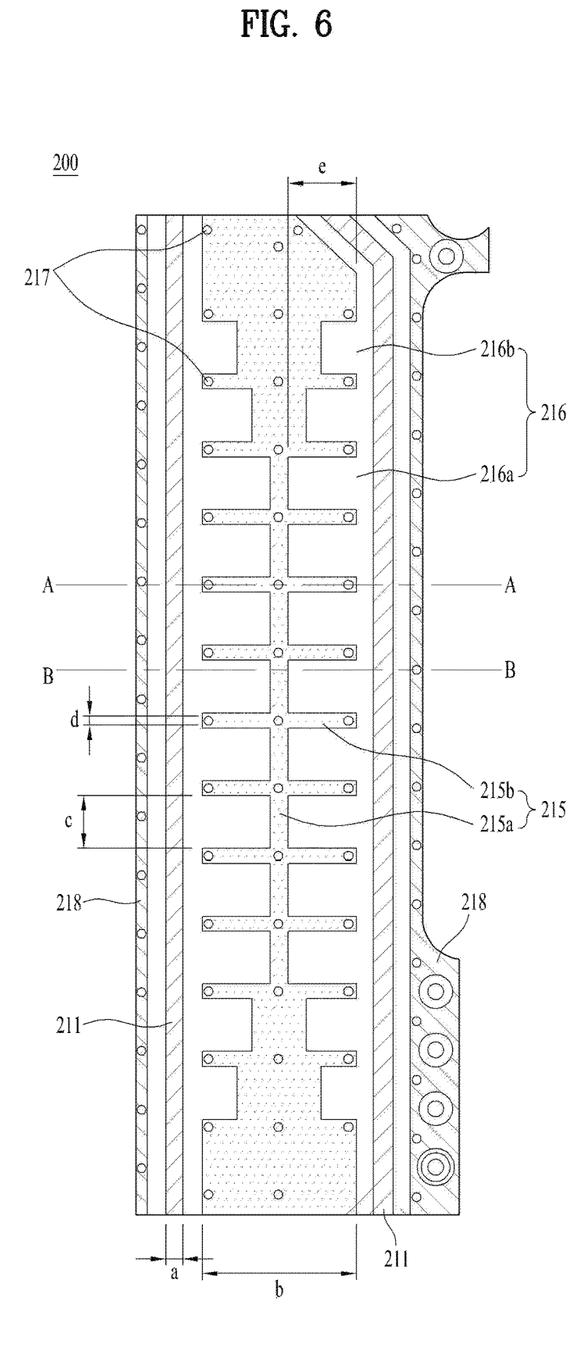
FIG. 6 is a diagram of a circuit structure or circuit according to another embodiment.

FIG. 6 is a diagram a diagram of a circuit structure or circuit according to another embodiment. In circuit structure 200 of transmission lines 211, first guard pattern 215 may be configured with a first pattern 215a and a plurality of second patterns 215b. The first pattern 215a may extend vertically, and the second patterns 215b may extend horizontally. The first pattern 215a and the second patterns 215b may form slots 216, while intersecting at right angles.

Second guard pattern 218 may be arranged equally spaced apart in alignment with via 217 formed in first guard pattern 215, so as to form slots 216 equally spaced apart from each other. If the slots 216 are arranged asymmetrically, abnormal resonance may be generated and may increase noise. Accordingly, slots 216 and vias 217 may be bilaterally symmetrical. A size (d) of via 217 may be as small as possible because a thickness of the first pattern 215a and a thickness of the second pattern 215b may be limited or small.

When slots 216 are bilaterally symmetrical and equally spaced apart from each other, a distance (c) between the second patterns 215b may be 1/200 with respect to a wavelength of a signal considering a size of circuit structure 200, and noise may be minimized. In case of using a signal in 3 GHz band, the distance (c) between the second patterns 215b may be approximately 0.5 mm.

Currents of the transmission lines 211 may be distributed intensively to an area of a reference surface under the line, and the area may be 3 times the line width of the transmission lines 211. A width of first guard pattern 215, or a width (b) of the second pattern 215b, may be 3 times or more of a width (a) of the transmission lines 211. A size of the capacitance may be adjusted by adjusting a width (e) of slots 216 so that cross talk may be adjusted.

The first pattern 215a may become wider toward one end. If a line width of first guard pattern 215 becomes smaller suddenly, currents passing through first guard pattern 215 may form a bottleneck. A width of the first pattern 215a may become smaller sequentially. The line width may gradually decrease like steps. In other words, a width of one slot 216b positioned near an end may be smaller than a width of another slot 216a positioned in or at a center.

Figure 7:
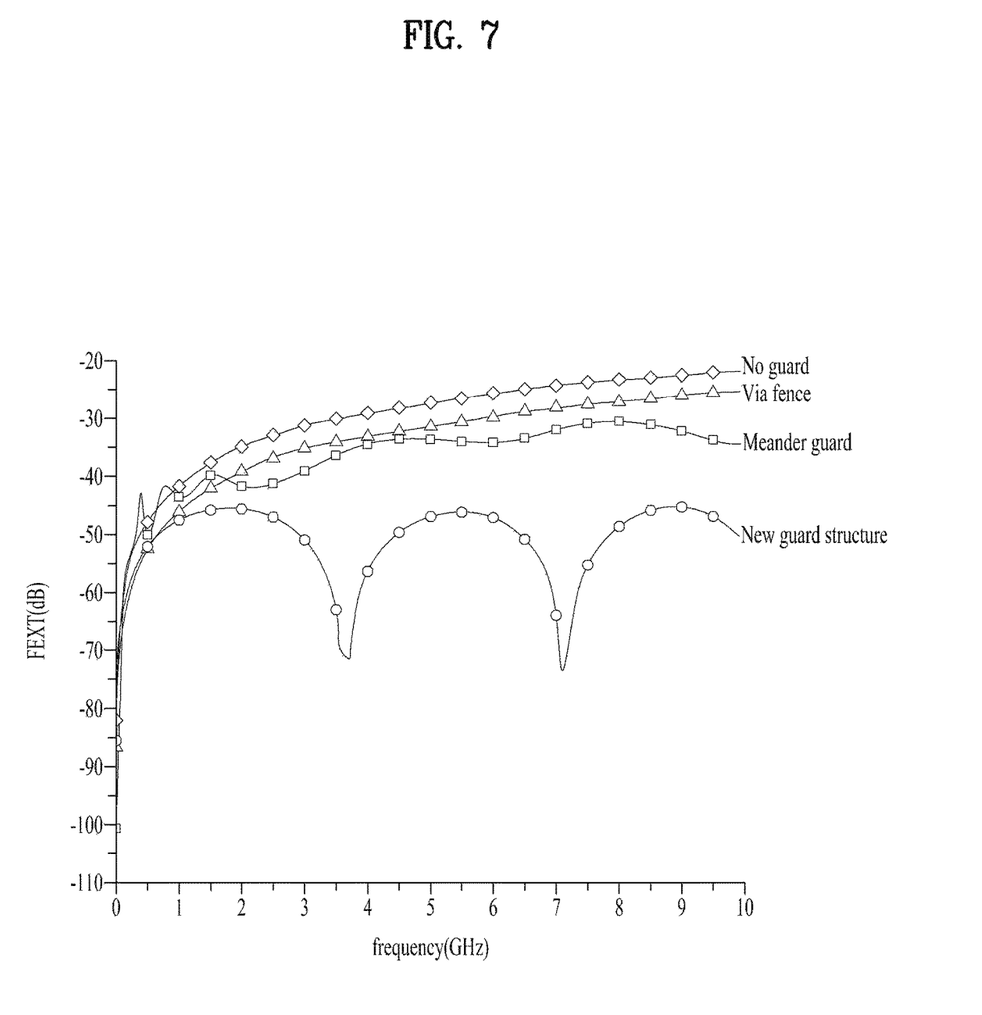
FIG. 7 is a graph illustrating cross talk of circuit structures shown in FIGS. 3, 5 and 6 for each frequency.

FIG. 7 is a graph illustrating cross talk (i.e. FEXT(db)) of circuit structures shown in FIGS. 3, 5 and 6 for each frequency in GHz. 'Via fence' is a plot of cross talk of circuit structure 200 of FIG. 3, 'Meander guard' is a plot of cross talk of circuit structure 200 of FIG. 5, and 'New guard structure' is a plot of cross talk of circuit structure 200 of FIG. 6. In the embodiment of FIG. 3 (represented by the via fence plot in FIG. 7), which includes via 217 formed in first guard pattern 215, compared to an embodiment in which transmission lines 211 have no guard pattern (represented by a 'No guard' plot in FIG. 7), cross talk may be lowered and more noise may be reduced. The meander-type first guard pattern 215 shown in FIG. 5 (represented by the meander guard plot in FIG. 7) may produce lower cross talk. First guard pattern 215 configured with the first pattern 215a and the second patterns 215b intersecting at crossroads shown in FIG. 6 may produce the lowest cross talk.

Cross talk may be reduced by providing first guard pattern 215 between transmission lines 211. The shape of the first guard pattern 215 may be adjusted according to a length of a frequency or a width of the transmission lines 211 and the more cross talk is reduced enough to improve the quality of the signal.

Figure 9A:
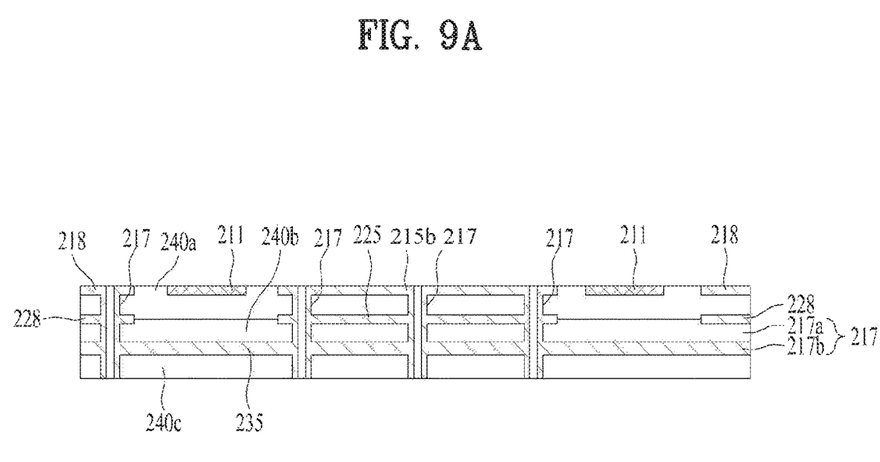
FIG. 9A is a sectional diagram along A-A of FIG. 6.
Figure 9B:
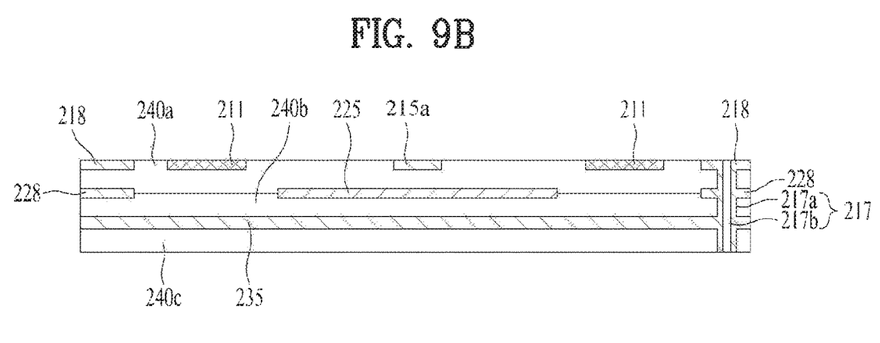
FIG. 9B is a sectional diagram along B-B of FIG. 6.

FIG. 8 is an exploded perspective diagram of FIG. 6. FIG. 9A is a sectional diagram along A-A of FIG. 6. FIG. 9B is a sectional diagram along B-B of FIG. 6. As mentioned above, the connection board or circuit structure 200 (FIG. 8) may be configured with the plurality of the layers to improve quality of the signal by widening an overall area of a guard pattern. Three layers may be provided, and each of the layers may include insulative films 240*a*, 240*b* and 240*c* provided between two of the conductive patterns. The conductive patterns formed in the layers may be connected with each other by the via 217. The via 217 may be connected to the conductive patterns positioned thereunder and may penetrate the insulative films 240*a*, 240*b* and 240*c*.

The first guard pattern 215, the second guard pattern 218, and the transmission lines 211 mentioned above may be positioned in the first layer 210. A third guard pattern 225 and a fourth guard pattern 228 may be positioned in the second layer 220. The third ground pattern 225 may correspond to the first ground pattern 215, and a shape of the third ground pattern 225 may be rectangular, not configured with the first ground pattern 215*a* (FIG. 8) and the second patterns 215*b* (FIG. 6) of the first ground pattern 215 shown in FIG. 3.

The second layer 220 may be close to the transmission lines 211. If the third and fourth guard patterns 225 and 228 are directly formed under the transmission lines 211, the signal might flow out or noise might flow in through the guard pattern. Accordingly, the third and fourth guard patterns 225 and 228 may be formed in another area than an area corresponding to the transmission lines 211. The third layer 230 may include a fifth guard pattern 235, and the fifth guard pattern 235 may be arranged in a position so as to cover all of the first guard pattern 215, the transmission lines 211, and the second guard pattern 218. The third layer 230 may be sufficiently apart or distant from the transmission lines 211, and the fifth guard pattern 235 may be formed even in an area corresponding to the transmission lines 211 so as to maximize the guard area.

Referring to FIGS. 9A and 9B, the first, second, third, fourth and fifth guard patterns 215, 218, 225, 228, 235 may be connected with each other by the via 217. FIG. 9A shows a cross section of an area where the second patterns 215*b* may be positioned at (A-A) as shown in FIG. 6 and where the first guard pattern 215 may be widely formed in the first layer 210 (FIG. 8). FIG. 9B shows an area where the slots 216 may be positioned at (B-B) as shown in FIG. 6 and where only the first pattern 215*a* may be positioned in the first layer 210 (FIG. 8) and the first guard pattern 215 may be narrowly formed in the first layer 210 (FIG. 8).

As mentioned above, the guard pattern may be arranged between the transmission lines 211 in the circuit structure 200, and cross talk may be lowered by adjusting the mutual capacitance. Accordingly, the quality of the signal may be improved. The slots 216 may formed symmetrically in the first guard pattern 215. Accordingly, needless or abnormal resonance and noise and the quality of the signal may be improved. The width of the first guard pattern 215 may be 3 times or more the width of the transmission lines 211. Accordingly, signal transmission efficiency may be improved. According to embodiments disclosed herein, a mobile terminal including a circuit structure may be capable of reducing noise, which may be generated by cross talk, even without enlarging a gap between transmission lines.

Embodiments disclosed herein provide a circuit structure including: two transmission lines extended in a first direction and configured to transmit a signal; and a first guard pattern provided between the two lines, the first guard pattern preventing electrical interference between the two transmission lines, wherein the first guard pattern comprises a plurality of slots, at least one of the slots having an open end and a closed end in a second direction.

The first guard pattern may include a first pattern extended in the first direction; and a plurality of second patterns extended in a second direction which is perpendicular to the first direction and configured to intersect the first pattern at right angles, and the first pattern and the second patterns form the slots. The slits may be configured with the first pattern and the second patterns. The plurality of the second patterns may be spaced apart at equidistant intervals. The equidistant internal may be ½00 of a wavelength of a transmitted signal.

The second pattern may be partially positioned in the first pattern, and the other area of the first pattern not overlapped with or intersecting the second pattern may have a first width in the second direction, and the area of the first pattern overlapped with or intersecting the second pattern may have a second width in the second direction. The length of the second pattern along the second direction may be corresponding to the first width. The first pattern may gradually change in a section where the first width of the first pattern changes into the second width. The second width may be 3 times or more of the width of the transmission lines along the second direction.

The circuit structure may further include a plurality of vias formed in the first guard pattern. The plurality of the vias may be formed in a center area of the first pattern. The plurality of the vias may be formed in the overlapped area of the first and second patterns. The plurality of the vias may be formed in one end of the second pattern in the second direction.

The circuit structure may further include a second guard pattern provided in an outer area from the two transmission lines. The circuit structure may further include a first layer comprising the two transmission lines, the first guard pattern and the second guard pattern; a second layer positioned under the first layer, and comprising a third guard pattern connected with the first guard pattern via the vias and a fourth guard pattern connected with the second guard pattern via the via; and a third layer positioned under the second layer, and comprising a fifth guard pattern connected with the first guard patter, the second guard pattern, the third guard pattern and the fourth guard pattern via the vias. The width of the third guard pattern may be corresponding to the width of the first guard pattern.

Each of the first, second and third layers may include an insulative film configured to distinguish the first, second, third, fourth and fifth guard patterns and the transmission lines from each other. The plurality of the slots may be arranged symmetrically in the second direction. The plurality of the slots may be arranged in the first direction, and the open ends may be alternatively arranged in one area and the other area with respect to the second direction.

Embodiments disclosed herein provide a mobile terminal including a case; and a main board comprising an upper main board provided in an upper area within the case, a lower main board provided in a lower area within the case and a connection board connecting the upper main board and the lower main board with each other, wherein the connection board includes two transmission lines extended in a first direction and configured to transmit a signal; and a guard pattern provided between the two transmission lines, the guard pattern preventing electrical interference between the two transmission lines and including a plurality of slots, at least one of the slots having an open end and a closed end in a second direction.

Mobile terminals presented herein may be implemented using a variety of different types of terminals, such as, e.g., cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, and head mounted displays (HMDs).

By way of non-limiting example only, description may be made with reference to particular types of mobile terminals. However, such teachings apply equally to other types of terminals, such as those types noted above. In addition, these teachings may also be applied to stationary terminals, such as, e.g., digital TV, and desktop computers.

For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

Although the terms "first", "second", etc. may be used herein to describe various elements, these elements should not be limited by these terms. These terms may be generally only used to distinguish one element from another. When an element is referred to as being "connected with" another element, the element may be directly connected with the other element or intervening elements may also be present. In contrast, when an element is referred to as being "directly connected with" another element, there may be no intervening elements present.

A singular representation may include a plural representation unless it represents a definitely different meaning from the context. Terms such as "include" or "has" may be used herein and may indicate an existence of several components, functions or steps, disclosed in the specification, and greater or fewer components, functions, or steps may likewise be utilized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
a case;
a first main board provided in an upper area within the case, a second main board provided in a lower area within the case, and a connection board that connects the first main board and the second main board with each other,
wherein the connection board includes:
two transmission lines that extend in a first direction to transmit a signal; and
a guard pattern provided between the two transmission lines, the guard pattern preventing electrical interference between the two transmission lines and including a plurality of slots, at least one of the slots having a respective open end and a corresponding closed end in a second direction, wherein the first guard pattern includes:
a first pattern that extends in the first direction, a first width of respective ends of the first pattern being larger than a second width of a middle portion of the first pattern; and
a plurality of second patterns arranged side by side along the first direction,
wherein adjacent ones of the plurality of second patterns extend in the second direction, which is perpendicular to the first direction, to intersect the middle portion of the first pattern at right angles thereto, and
wherein the first pattern and the plurality of second patterns are connected and form the plurality of slots between adjacent ones of the plurality of second patterns.

2. A circuit structure comprising:
two transmission lines that extend in a first direction to transmit a signal; and
a first guard pattern provided between the two transmission lines, the first guard pattern preventing electrical interference between the two transmission lines and including a plurality of slots, at least one of the slots having a respective open end and a corresponding closed end in a second direction, wherein the first guard pattern includes:
a first pattern that extends in the first direction, a first width of respective ends of the first pattern being larger than a second width of a middle portion of the first pattern; and
a plurality of second patterns arranged side by side along the first direction,
wherein of the plurality of second patterns extend in the second direction, which is perpendicular to the first direction, such that a middle portion of each of the second patterns intersects the first pattern at right angles thereto, and
wherein the first pattern and the plurality of second patterns are connected and form the plurality of slots between adjacent ones of the plurality of second patterns.

3. The circuit structure of claim 2, wherein the plurality of the second patterns are spaced apart at equidistant intervals.

4. The circuit structure of claim 3, wherein the equidistant interval is $1/200$ of a wavelength of a transmitted signal in the two transmission lines.

5. The circuit structure of claim 2, wherein the plurality of the slots are symmetrically provided in the second direction.

6. The circuit structure of claim 2, wherein a length of the second pattern along the second direction correspond to the first width.

7. The circuit structure of claim 2, wherein the first pattern gradually changes in a section where the first width of the first pattern changes into the second width.

8. The circuit structure of claim 2, wherein the second width is 3 times or more of a width of the transmission lines.

9. The circuit structure of claim 2, further comprising:
a plurality of vias formed in the first guard pattern.

10. The circuit structure of claim 9, wherein the plurality of the vias are provided in the middle portion of the first pattern.

11. The circuit structure of claim 10, wherein the plurality of the vias are provided in an overlapping area where the middle portion of each of the second patterns intersects the first pattern.

12. The circuit structure of claim 9, wherein the plurality of the vias are provided in one end of the second pattern in the second direction.

13. The circuit structure of claim 2, further comprising:
second guard patterns, each of the transmission lines placed between adjacent ones of the second guard patterns and the first guard pattern.

14. The circuit structure of claim 13, further comprising:

a first layer including the two transmission lines, the first guard pattern, and the second guard pattern;

a second layer provided under the first layer and including a third guard pattern and a fourth guard pattern;

a third layer provided under the second layer and including a fifth guard pattern; and a plurality of vias that connect the fifth guard pattern and at least one of the first guard pattern, the second guard pattern, the third guard pattern and the fourth guard pattern.

15. The circuit structure of claim 14, wherein a width of the third guard pattern corresponds to the first width of the first guard pattern.

16. The circuit structure of claim 14, further comprising insulative films placed between the first layer and the second layer and between the second layer and the third layer.

* * * * *